US009246087B1

(12) United States Patent
Wang et al.

(10) Patent No.: US 9,246,087 B1
(45) Date of Patent: Jan. 26, 2016

(54) ELECTRON BARRIER HEIGHT CONTROLLED INTERFACES OF RESISTIVE SWITCHING LAYERS IN RESISTIVE RANDOM ACCESS MEMORY CELLS

(71) Applicant: Intermolecular Inc., San Jose, CA (US)

(72) Inventors: Yun Wang, San Jose, CA (US); Federico Nardi, Palo Alto, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/551,878

(22) Filed: Nov. 24, 2014

(51) Int. Cl.
*H01L 45/00* (2006.01)

(52) U.S. Cl.
CPC .............. *H01L 45/12* (2013.01); *H01L 45/06* (2013.01); *H01L 45/1233* (2013.01); *H01L 45/145* (2013.01); *H01L 45/148* (2013.01); *H01L 45/1608* (2013.01)

(58) Field of Classification Search
CPC ........................................ H01L 45/04–45/1691
See application file for complete search history.

(56) References Cited

U.S. PATENT DOCUMENTS

| 5,825,046 | A  | * | 10/1998 | Czubatyj et al. ................ 257/2 |
| 7,629,198 | B2 | * | 12/2009 | Kumar et al. ................ 438/104 |
| 8,288,297 | B1 | * | 10/2012 | Wang et al. ................ 438/785 |
| 8,354,660 | B2 | * | 1/2013  | Sekar et al. ................ 257/4 |
| 8,681,530 | B2 | * | 3/2014  | Wang et al. ................ 365/148 |
| 8,686,389 | B1 | * | 4/2014  | Wang et al. ................ 257/2 |
| 8,883,557 | B1 | * | 11/2014 | Hsueh et al. ................ 438/104 |
| 8,930,174 | B2 | * | 1/2015  | Lu ................ 703/14 |
| 9,012,878 | B1 | * | 4/2015  | Mathur ................ 257/2 |
| 2006/0278900 | A1 | * | 12/2006 | Chang et al. ................ 257/248 |
| 2007/0015348 | A1 | * | 1/2007  | Hsu et al. ................ 438/570 |
| 2007/0114508 | A1 | * | 5/2007  | Herner et al. ................ 257/2 |
| 2009/0026433 | A1 | * | 1/2009  | Chiang ................ 257/2 |
| 2009/0224224 | A1 | * | 9/2009  | Fujii et al. ................ 257/2 |
| 2009/0272962 | A1 | * | 11/2009 | Kumar et al. ................ 257/4 |
| 2010/0102289 | A1 | * | 4/2010  | Dimitrov et al. ................ 257/2 |
| 2010/0163823 | A1 | * | 7/2010  | Sim et al. ................ 257/2 |
| 2010/0315857 | A1 | * | 12/2010 | Sonehara et al. ................ 365/148 |
| 2011/0204316 | A1 | * | 8/2011  | Kreupl et al. ................ 257/5 |
| 2011/0260131 | A1 | * | 10/2011 | Sonehara ................ 257/2 |
| 2011/0266510 | A1 | * | 11/2011 | Quitoriano et al. ................ 257/2 |
| 2011/0266513 | A1 | * | 11/2011 | Williams et al. ................ 257/4 |
| 2011/0310655 | A1 | * | 12/2011 | Kreupl et al. ................ 365/148 |

(Continued)

OTHER PUBLICATIONS

Lee et al.; MultiLevel Switching of TripleLayered TaOx RRAM with Excellent Reliability for Storage Class Memory; Jan. 1, 2012; 2012 Symposium on VLSI Technology Digest of Technical Papers; Unknown.

*Primary Examiner* — Matthew Landau
*Assistant Examiner* — Grant Withers

(57) ABSTRACT

Provided are resistive switching memory cells and method of forming such cells. A memory cell includes a resistive switching layer disposed between two buffer layers. The electron barrier height of the material used for each buffer layer is less than the electron barrier height of the material used for the resistive switching layer. Furthermore, the thickness of each buffer layer may be less than the thickness of the resistive switching layer. The buffer layers reduce diffusion between the resistive switching layer and electrodes. Furthermore, the buffer layers improve data retention and prevent unintentional resistive switching when a reading signal is applied to the memory cell. The reading signal uses a low voltage and most of the electron tunneling is blocked by the buffer layers during this operation. On the other hand, the buffer layers allow electrode tunneling at higher voltages used for forming and switching signals.

18 Claims, 5 Drawing Sheets

(56) References Cited

U.S. PATENT DOCUMENTS

| | | | |
|---|---|---|---|
| 2012/0049147 A1* | 3/2012 | Hong et al. | 257/4 |
| 2012/0056145 A1* | 3/2012 | Aoyama et al. | 257/2 |
| 2012/0068144 A1* | 3/2012 | Fujitsuka et al. | 257/4 |
| 2012/0091419 A1* | 4/2012 | Chen et al. | 257/4 |
| 2012/0176831 A1* | 7/2012 | Xiao et al. | 365/148 |
| 2012/0217461 A1* | 8/2012 | Kobayashi et al. | 257/2 |
| 2012/0223286 A1* | 9/2012 | Yang et al. | 257/5 |
| 2012/0267596 A1* | 10/2012 | Tseng et al. | 257/4 |
| 2012/0305878 A1* | 12/2012 | Miller et al. | 257/4 |
| 2013/0056700 A1* | 3/2013 | Wang et al. | 257/4 |
| 2013/0065377 A1* | 3/2013 | Gopal et al. | 438/382 |
| 2013/0069030 A1* | 3/2013 | Wells et al. | 257/4 |
| 2013/0148404 A1* | 6/2013 | Bandyopadhyay et al. | 365/103 |
| 2013/0214236 A1* | 8/2013 | Lu et al. | 257/4 |
| 2013/0221307 A1* | 8/2013 | Wang et al. | 257/2 |
| 2013/0228735 A1* | 9/2013 | Higuchi et al. | 257/4 |
| 2013/0338089 A1* | 12/2013 | Chan et al. | 514/27 |
| 2014/0117303 A1* | 5/2014 | Wang et al. | 257/4 |
| 2014/0124725 A1* | 5/2014 | Chi et al. | 257/4 |
| 2014/0175354 A1* | 6/2014 | Wang et al. | 257/2 |
| 2014/0175356 A1* | 6/2014 | Wang et al. | 257/2 |
| 2014/0175603 A1* | 6/2014 | Ananthan et al. | 257/532 |
| 2014/0185357 A1* | 7/2014 | Barabash et al. | 365/148 |
| 2014/0377931 A1* | 12/2014 | Tendulkar et al. | 438/382 |
| 2015/0016178 A1* | 1/2015 | Nardi et al. | 365/148 |

* cited by examiner

ELECTRON BARRIER HEIGHT CONTROLLED INTERFACES OF RESISTIVE SWITCHING LAYERS IN RESISTIVE RANDOM ACCESS MEMORY CELLS

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are resistive switching memory cells and method of forming such cells. A memory cell includes a resistive switching layer disposed between two buffer layers. The electron barrier height of the material used for each buffer layer is less than the electron barrier height of the material used for the resistive switching layer. Furthermore, the thickness of each buffer layer may be less than the thickness of the resistive switching layer. The buffer layers reduce diffusion between the resistive switching layer and electrodes. Furthermore, the buffer layers improve data retention and prevent unintentional resistive switching when a reading signal is applied to the memory cell. The reading signal uses a low voltage and most of the electron tunneling is blocked by the buffer layers during this operation. On the other hand, the buffer layers allow electrode tunneling at higher voltages used for forming and switching signals.

In some embodiments, a resistive switching memory cell includes a first layer, second layer, third layer, fourth layer, and fifth layer. The first layer is disposed over a substrate and may be operable as an electrode. This layer may be referred to as a first electrode. The second layer is disposed over the first layer such that the first layer is disposed between the second layer and the substrate. The second layer may be referred to as a first buffer layer. The third layer is disposed over the second layer such that the second layer is disposed between the first layer and the third layer. The third layer is operable to switch between at least two different resistive states and may include silicon or aluminum and may be referred to as a resistive switching layer. The fourth layer is disposed over the third layer such that the third layer is disposed between the second layer and the fourth layer. The fourth layer may be referred to as a second buffer layer. The fifth layer is disposed over the fourth layer such that the fourth layer is disposed between the third layer and the fifth layer. The fifth layer is also operable as an electrode and may be referred to as a second electrode. In some embodiments, the third layer directly interfaces each of the second and fourth layers. The third layer may include one of silicon oxide, silicon oxynitride, aluminum oxide, or aluminum oxynitride. In some embodiments, the electron barrier height of the material of each of the second layer and the fourth layer is less than the electron barrier height of a material of the third layer.

In some embodiments, the second layer and fourth layer have substantially same compositions. Alternatively, the second layer and fourth layer have different compositions. The electron barrier heights of these layers may be also different, as a result. Each of the second layer and fourth layer may include one of hafnium oxide, hafnium oxynitride, zirconium oxide, zirconium oxynitride, titanium oxide, titanium oxynitride, tantalum oxide, or tantalum oxynitride. More specifically, each of the second layer and fourth layer comprises one of hafnium oxide, hafnium oxynitride, zirconium oxide, or zirconium oxynitride. The materials have electron barrier heights lower than electron barrier heights of silicon oxide or silicon oxynitride, which may be used for the third layer.

In some embodiments, the second layer and fourth layer have substantially the same thickness. For example, the thicknesses of the second layer and fourth layer may vary by less than 10% or even by less than 5%. Alternatively, the second layer and fourth layer have substantially different thicknesses. For example, the thicknesses of the second layer and fourth layer may vary by more than 10% or even by more than 20%. In some embodiments, the thickness of the third layer is greater than the thickness of each of the second and fourth layers. For example, the thickness of the third layer may be at least 20% greater than the thickness of each of the second and fourth layers or even 50% greater. Similar to the electron barrier height, the thickness of buffer layers also impacts electron tunneling as further described below.

In some embodiments, the product of the third layer thickness times the third layer electron barrier height (i.e., $T_3 \times WF_3$) is greater than each of the product of the second layer thickness times the second layer electron barrier height (i.e., $T_2 \times WF_2$) and the product of the fourth layer thickness times the fourth layer electron barrier height (i.e., $T_4 \times WF_4$). In other words, $T_3 \times WF_3 > T_2 \times WF_2$ and $T_3 \times WF_3 > T_4 \times WF_4$. More specifically, the product of the third layer thickness times the third layer electron barrier height (i.e., $T_3 \times WF_3$) may be at least twice greater than each of the product of the second layer thickness times the second layer electron barrier height (i.e., $T_2 \times WF_2$) and the product of the fourth layer thickness times the fourth layer electron barrier height (i.e., $T_4 \times EBH_4$). In other words, $T_3 \times EBH_3 \geq 2 \times (T_2 \times EBH_2)$ and $T_3 \times EBH_3 \geq 2 \times (T_4 \times EBH_4)$.

In some embodiments, the third layer electron barrier height is greater than 6 eV (i.e., $EBH_3 > 6$ eV). Specifically, the third layer electron barrier height is greater than 8 eV (i.e., $EBH_3 > 8$ eV). In some embodiments, each of the second layer electron barrier height and the fourth layer electron barrier height is less than 4 eV (i.e., $EBH_2 < 4$ eV and $EBH_4 < 4$ eV). In some embodiments, the third layer electron barrier height is greater than each of the second layer electron barrier height and the fourth layer electron barrier height by at least about 0.5 eV (i.e., $EBH_3 \geq EBH_2 + 0.5$ eV and $EBH_3 \geq EBH_4 + 0.5$ eV).

In some embodiments, the third layer is substantially amorphous. For example, the crystalline content of the third layer may be less than about 30% by volume or, more specifically, less than about 20% or even less than about 10%. The third layer remains amorphous during fabrication and operation of the resistive switching memory cell. In some embodiments, each of the second layer and the fourth layer is substantially crystalline. For example, the crystalline content of the each of the second and fourth layers may be greater than about 70% by volume or, more specifically, greater than about 80% or even greater than about 90%.

In some embodiments, the resistive switching memory cell also includes a sixth layer and a seventh layer. The sixth layer is disposed between the first layer and the second layer and may be referred to as a third buffer layer. The sixth layer electron barrier height is less than the second layer electron barrier height. The seventh layer is disposed between the fourth layer and the fifth layer and may be referred to as a fourth buffer layer. The seventh layer electron barrier height is less than the second layer electron barrier height. In some embodiments, each of the sixth layer and the seventh layer includes one of titanium oxide, titanium oxynitride, tantalum oxide, or tantalum oxynitride. Furthermore, the product of the sixth layer thickness times the sixth layer electron barrier height (i.e., $T_6 \times EBH_6$) is less than the product of the second layer thickness times the second layer electron barrier height (i.e., $T_2 \times EBH_2$). Likewise, the product of the seventh layer thickness times the seventh layer electron barrier height (i.e., $T_7 \times EBH_7$) is less the product of the fourth layer thickness times the fourth layer electron barrier height (i.e., $T_4 \times EBH_4$). In other words, $T_2 \times EBH_2 > T_6 \times EBH_6$ and $T_4 \times EBH_4 > T_7 \times EBH_7$.

Also provided is a method involving forming a first layer over a substrate, forming a second layer over the first layer, forming a third layer over the second layer, forming a fourth layer over the third layer, and forming a fifth layer over the fourth layer. Various examples of these layers are described and elsewhere in this document. Specifically, the first layer and the fifth layer are operable as electrodes and may be referred to as a first electrode and second electrode, respectively. The third layer is operable to switch between at least two different resistive states and may be referred to as a resistive switching layer. The third layer may include silicon. The second layer electron barrier height is less than the third layer electron barrier height. Likewise, the fourth layer electron barrier height is less than the third layer electron barrier height. The second layer and fourth layer may be referred to as a first buffer layer and a second buffer layer, respectively.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings.

DETAILED DESCRIPTION

Figure 1A:
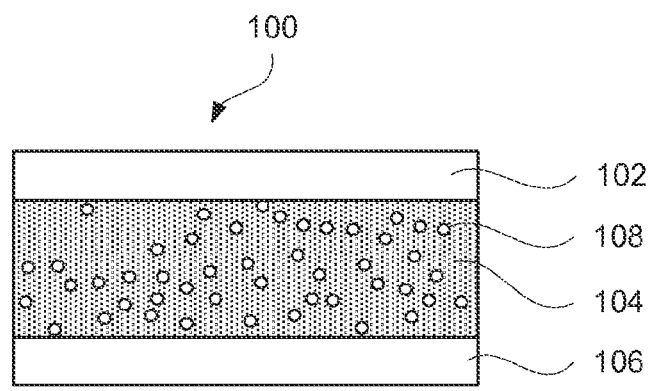
FIG. 1A illustrates a schematic representation of a ReRAM cell prior to initial forming operation, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A ReRAM cell exhibiting resistive switching characteristics generally includes multiple layers formed into a stack, such as a "metal-insulator-metal" (MIM) stack. The stack includes two conductive layers operating as electrodes, which are identified as "M" and may include a metal, but may also include other types of conductive materials, such as doped silicon. These conductive layers may be referred to as electrodes. The stack also includes an insulator layer provided in between the two electrodes and identified as "I". The insulator layer changes its resistive properties when a switching signal is applied to the layer or, more generally, to the ReRAM cell including this layer. Due to its variable resistance characteristics, the insulator layer may be also referred to as a variable resistance layer. These changes in resistive properties are used to store data. The resistive properties (and the current data) may be monitored by applying a reading signal, which does not change the resistive state of the insulator layer. For example, when two different resistive states are identified (e.g., a high resistive state and a low resistive state) for a ReRAM cell, one state may be associated with a logic "zero", while the other state may be associated with a logic "one" value. Similar approaches may be used when three or more resistive states may be identified for the same ReRAM cell leading to various multibit architectures.

The switching signal may be applied as one or more voltage pulses. Specifically, a switching voltage pulse may be used to change the resistive state followed by a smaller reading voltage pulse to determine the current state of the ReRAM cell after each application of the switching voltage pulse. The switching signal may include multiple switching pulses, e.g., applied one at the time until the desired resistive state is reached. In some embodiments, a single switching pulse may result in the desired resistive state. When multiple switching pulses are used, the switching pulses may vary from one to another based on their potential (e.g., a gradual increase in the potential), duration, and other characteristics. The same reading pulse may be used after each switching pulse.

While the switching signal is configured to change the resistivity state of the memory cell, the reading signal is configured to check this resistivity state without changing it. Thousands and even millions of switching and reading signals may be applied to the same cell during its operating life. Achieving repeatable performance over that many voltage pulses has been challenging since materials forming various components of ReRAM cells may change their compositions (due to materials diffusion), morphology (due to thermal and electrical stresses), and other characteristics leading to various undesirable drifts in performance. Conventional ReRAM cells us single layer structures or bi-layer structures, such as $TaOx/Ta_2O_5$, $HfO_x/HfO_2$, $HfO_x/AlO_x$, for resistive switching layers. Even when tri-layer structures are mentioned (e.g. TiOx/HfOx/AlOx), the electron barrier height of this stack increases from one side to the other (e.g., lowest electron barrier height/intermediate electron barrier height/highest electron barrier height). As such, conventional ReRAMs cell do not use a resistive switching layer component that has the highest electron barrier height in the middle of the resistive switching layer and isolated by other resistive switching layer components from electrodes.

Provided are resistive switching memory cells having specifically configured buffer layers to ensure repeatable performance of the memory cells over a large number of cycles. Specifically, each memory cell includes a resistive switching layer disposed between two buffer layers, which are in turn both disposed between two electrodes. As such, at least one buffer layer is disposed between each electrode and the resistive switching layer of the memory cell. In some embodiments, an electrode and resistive switching layer are separated by two or more buffer layers. A buffer layer reduces diffusion of materials between the resistive switching layer and the electrode. Furthermore, the buffer layer controls electron tunneling as further described below.

A buffer layer may be formed from a metal oxide, such as a transition metal oxide, or some other suitable material. The material of the buffer layer may be more susceptible to crystallization than, for example, the material of the resistive switching layer. In some embodiments, the material of the buffer layer is substantially crystalline during operation of the memory cell, while the material of the resistive switching layer is substantially amorphous. When the crystalline buffer layer directly interfaces the amorphous resistive switching layer, the crystal boundary of the buffer layer material may initiate filament formation in the resistive switching layer due to the uneven current density distribution through the crystalline buffer layer material (e.g., a higher current density at the crystal boundary).

Furthermore, the material of the buffer layer may have a lower electron barrier height than the material of the resistive switching layer. In some embodiments, the electron barrier height of the material forming the resistive switching layer is at least about 6 eV or even at least about 8 eV. The electron barrier height of the materials forming one or both buffer layers may be less than 4 eV, in some embodiments. Stacking a lower electron barrier height buffer layer between an electrode and a higher electron barrier height resistive switching layer helps preventing electron tunneling through the buffer layer and into the resistive switching layer when reading pulses are applied to the cell. The buffer layer effectively blocks electrons at low potentials associated with the reading pulses. This feature, in turn, prevents accidental resistive switching when only reading pulses are applied to the stack including the buffer layer and resistive switching layer. Without a buffer layer, the resistive switching layer may be exposed to excessive electron tunneling even at low potentials. As such, this electron tunneling may reform or break conductive paths in the resistive switching layer when only a reading signal is applied, which results in uncontrollable operation of the memory cell and highly undesirable. At the same time, the buffer layer blocking electron tunneling at low potentials allows to use various additional materials for resistive switching layers that are not suitable for conventional memory cells without buffer layers. These materials can be switched using much lower power than the conventional memory cells with very low risk of accidental switching when reading signals are applied.

Furthermore, a buffer layer creates a physical separation between an electrode and resistive switching layer and prevents diffusion of materials between the electrode and resistive switching layer. For example, some electrode materials, such as titanium nitride, can cause substantial depletion of oxygen from a resistive switching layer (e.g., a resistive switching layer formed from an oxide) when these electrode materials directly interface the resistive switching layer. Furthermore, when a titanium nitride electrode or other similar electrodes directly interface resistive switching layers, metals (e.g., titanium) may diffuse into the resistive switching layers causing these layers to change their performance characteristics. Without controlling or eliminating this depletion process, the composition change of the resistive switching layer may cause significant change in performance of the memory cell. For example, resistive switching layers formed from transition metal oxides may experience unintentional resistive switching, even when subjected to a reading signal, when these resistive switching layers directly interface titanium nitride electrodes. Without being restricted to any particular theory, it is believed that titanium nitride depletes oxygen from the transition metal oxides and causes excessive concentrations of oxygen vacancies in these oxides, which is responsible for resistive switching.

In some embodiments, two or more buffer layers may be used between an electrode and resistive switching layer. The buffer layers may have different compositions. For example, a buffer layer that is closer to the resistive switching layer may have a higher electron barrier height than a buffer layer that is further away from the resistive switching layer. When two buffer layers are used, a buffer layer that is closer to the resistive switching layer may be referred to as an inner buffer layer, while a buffer layer that is further away from the resistive switching layer may be referred to as an outer buffer layer.

Examples of Nonvolatile ReRAM Cells and their Switching Mechanisms

A brief description of ReRAM cells is provided for context and better understanding of various features associated with embedded resistors in the ReRAM cells. As stated above, a ReRAM cell includes a dielectric material formed into a layer exhibiting resistive switching characteristics. A dielectric, which is normally insulating, can be made to conduct through one or more conductive paths formed after application of a voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

FIG. 1A illustrates a schematic representation of ReRAM cell 100 including first electrode 102, second electrode 106, and resistive switching layer 104 disposed in between first electrode 102 and second electrode 106. It should be noted that the "first" and "second" references for electrodes 102 and 106 are used solely for differentiation and not to imply any processing order or particular spatial orientation of these electrodes. ReRAM cell 100 may also include other components, such as an embedded resistor, diode, diffusion barrier layer, and other components. ReRAM cell 100 is sometimes referred to as a memory element or a memory unit.

First electrode 102 and second electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface).

Resistive switching layer 104 which may be initially formed from a dielectric material and later can be made to conduct through one or more conductive paths formed within the layer by applying first a forming voltage and then a switching voltage. To provide this resistive switching functionality, resistive switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

FIG. 1A is a schematic representation of ReRAM cell 100 prior to initial formation of conductive paths, in accordance with some embodiments. Resistive switching layer 104 may include some defects 108. Additional defects 108 may be provided within first electrode 102 and may be later transferred to resistive switching layer 104 during the formation operation. In some embodiments, the resistive switching layer 104 has substantially no defects prior to forming operation and all defects are provided from first electrode 102 during forming. Second electrode 106 may or may not have any defects. It should be noted that regardless of presence or absence of defects in second electrode 106, substantially no defects are exchanged between second electrode 106 and resistive switching layer 104 during forming and/or switching operations.

Figure 1B:
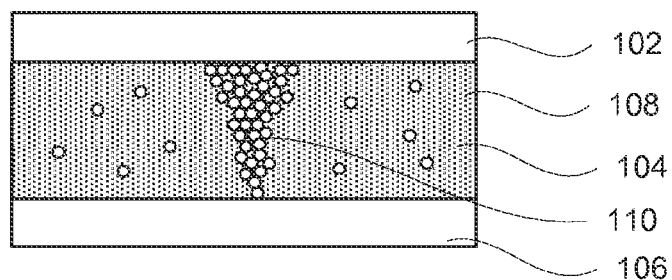
FIGS. 1B and 1C illustrate schematic representations of the ReRAM cell in its low resistive state (LRS) and high resistive state (HRS), in accordance with some embodiments.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistive switching layer 104 to form these conductive paths as, for example, schematically shown in FIG. 1B. Furthermore, some or all defects 108 forming the conductive paths may enter resistive switching layer 104 from first electrode 102. For simplicity, all these phenomena are collectively referred to as reorientation of defects within ReRAM cell 100. This reorientation of defects 108 occurs when a certain forming voltage is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Figure 1C:
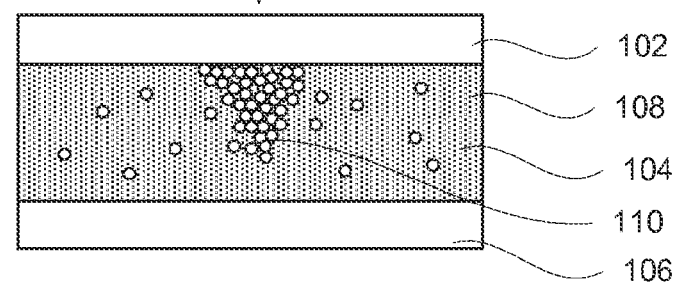

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or formed back again. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into first electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and first electrode 102, the conductive paths may break closer to the interface with second electrode 106, somewhere within resistive switching layer 104, or at the interface with first electrode 102. This breakage generally does not correspond to complete dispersion of defects forming these conductive paths and may be a self-limiting process, i.e., the process may stop after some initial breakage occurs.

When switching from its HRS to LRS, which is often referred to as a set operation, resistive switching layer 104 may receive some defects from first electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 106 during the set operation has the same polarity as a voltage applied during the reset operation. This type of switching is referred to as unipolar switching. Alternatively, a voltage applied to electrodes 102 and 106 during the set operation may have different polarity as a voltage applied during the reset operation.

This type of switching is referred to as bipolar switching. Setting and resetting operations may be repeated multiple times as will now be described with reference to FIGS. 2A and 2B.

Figure 2A:
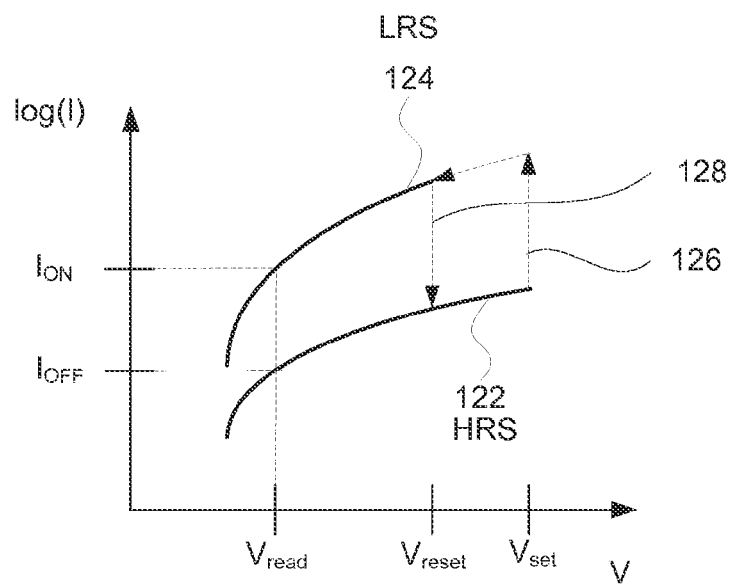
FIG. 2A illustrates a plot of a current passing through a unipolar ReRAM cell as a function of a voltage applied to the ReRAM cell, in accordance with some embodiments.
Figure 2B:
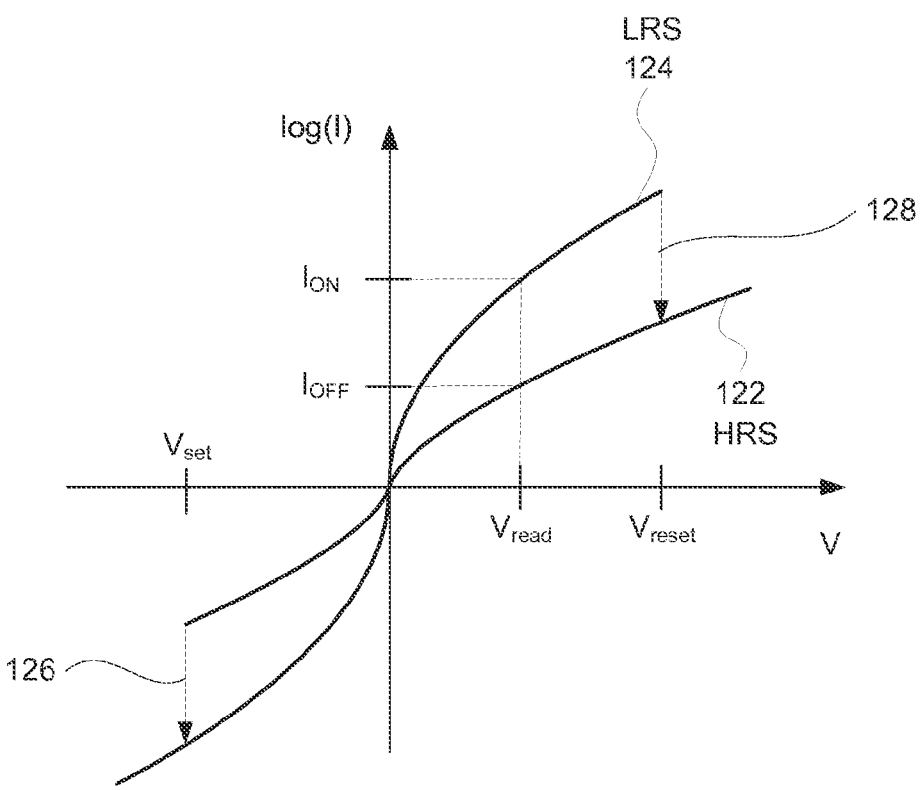
FIG. 2B illustrates a plot of a current passing through a bipolar ReRAM cell as a function of a voltage applied to the ReRAM cell, in accordance with some embodiments.

Specifically, FIG. 2A illustrates a plot of a log current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistive switching layer can be sensed by applying a sensing voltage to its electrodes. The sensing voltage is sometimes referred to as a "READ" voltage or simply a reading voltage and indicated as $V_{READ}$ in FIG. 2. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistive switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistive switching layer. Switching from a LRS to HRS is indicated by dashed line 128. Detecting the state of the ReRAM cell while it is in its HRS is described above.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm$^2$ measured at 0.5 V per 20 Å of oxide thickness in HRS.

Examples of ReRAM Cells

Figure 3A:
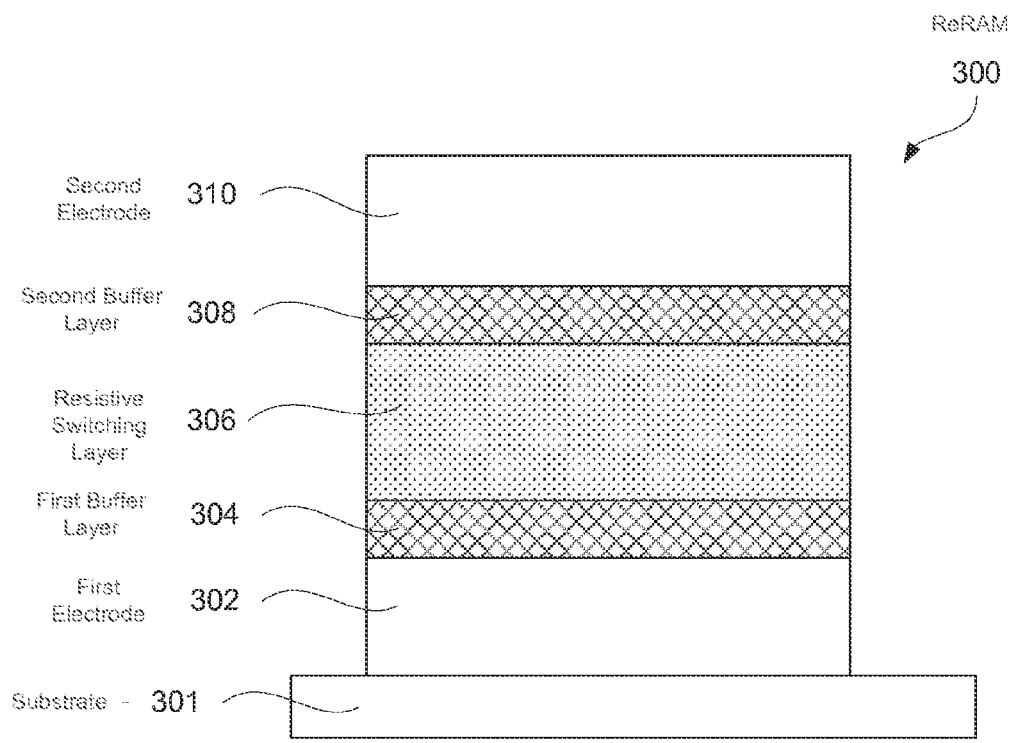
FIG. 3A illustrates a schematic representation of a ReRAM cell including a resistive switching layer disposed between two buffer layers, and other components, in accordance with some embodiments.

FIG. 3A illustrates a schematic representation of a ReRAM cell 300, in accordance with some embodiments. ReRAM cell 300 may include first electrode 302, first buffer layer 304, resistive switching layer 306, second buffer layer 308, and second electrode 310. The "first" and "second" terminology is used herein only for differentiating reasons and does not imply any deposition order or spatial orientation of the layers unless specifically noted. In the example shown in FIG. 3A, first electrode 302 may be referred to as a first layer, first buffer layer 304 may be referred to as a second layer, resistive switching layer 306 may be referred to as a third layer, second buffer layer 308 may be referred to as a fourth layer, and second electrode 310 may be referred to as a fifth layer. ReRAM cell 300 may be positioned on substrate 301. More specifically, first electrode 302 may directly interface substrate 301. Substrate 301 may include other ReRAM cells. For example, substrate 301 may include an array of ReRAM cells as further described below with reference to FIGS. 5A and 5B. Substrate 301 may also include signal lines for connecting ReRAM cell 300 to other components. Alternatively, first electrode 302 and/or second electrode 310 may be operable as signal lines.

In some embodiments, ReRAM cell 300 has more or fewer layers. One example of a ReRAM cell having additional buffer layers is described below with reference to FIG. 3B. In some embodiments, a ReRAM cell may include an embedded resistor configured to maintain a substantially constant resistance while the ReRAM cell goes through resistive switching. Alternatively, one or both buffer layers 304 and 308 of ReRAM cell 300 may be operable as embedded resistor. Furthermore, a ReRAM cell may include a current steering element.

The components of ReRAM cell 300 are arranged in such a way that at least one buffer layer is disposed between each one of electrodes 302 and 310 and resistive switching layer 306. In some embodiments, multiple buffer layers may be disposed between each electrode and resistive switching layer. In the example shown in FIG. 3A, first buffer layer 304 is disposed between first electrode 302 and resistive switching layer 306. Furthermore, second buffer layer 308 is disposed between resistive switching layer 306 and second electrode 310. Another way to describe this arrangement of components in ReRAM cell 300 as illustrated in FIG. 3A is as follows. First electrode 302 is disposed over substrate 301. First buffer layer 304 is disposed over first electrode such that first electrode 302 is disposed between first buffer layer 304 and substrate 301. Resistive switching layer 306 is disposed over first buffer layer 304 such that first buffer layer 304 is disposed between first electrode 302 and resistive switching layer 306. Second buffer layer 308 is disposed over resistive switching layer 306 such that resistive switching layer 306 is disposed between first buffer layer 304 and second buffer layer 308. Second electrode 310 is disposed over second buffer layer 308 such that second buffer layer 308 is disposed between resistive switching layer 306 and second electrode 310. A bipolar cell would use two buffer layers positioned on each side of its resistive switching layer. However, unipolar cells may need only one buffer, which is also within the scope of this disclosure.

Figure 3B:
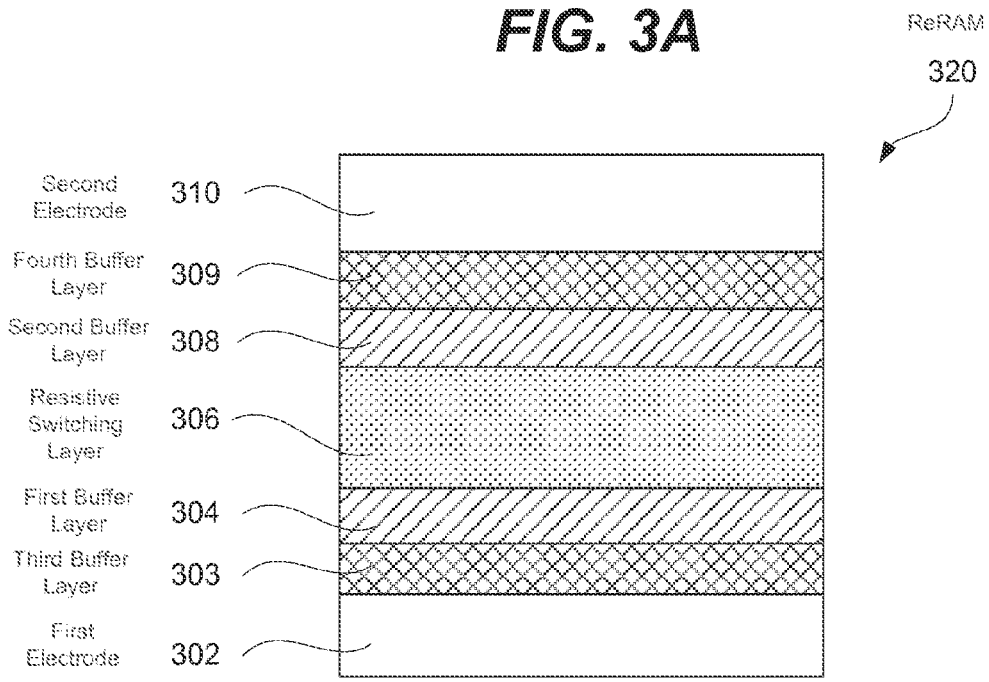
FIG. 3B illustrates a schematic representation of a ReRAM cell including two sets of buffer layers, each set including two buffer layers and separating a resistive switching layer from a corresponding electrode, in accordance with some embodiments.

One or both buffer layers may directly interface a resistive switching layer. For example, FIG. 3A illustrates first buffer layer 304 directly interfacing resistive switching layer 306 and second buffer layer 308 directly interfacing resistive switching layer 306. In some embodiments, a buffer layer may be separated from a resistive switching layer by another component, such as another buffer layer. For example, FIG. 3B illustrates third buffer layer 303 being separated from resistive switching layer 306 by first buffer layer 304. FIG. 3B also illustrates fourth buffer layer 309 being separated from resistive switching layer 306 by second buffer layer 308. In some embodiments, other components may be used to separate buffer layers from a resistive switching layer, such as diffusion barrier layers, oxygen control layers, embedded resistors, current steering elements, and the like.

The value of the electron barrier height of the material used for each of first buffer layer 304 and second buffer layer 308 may be less than the value of the electron barrier height of the material used for resistive switching layer 306. As described above, the lower electron barrier height materials of first buffer layer 304 and second buffer layer 308 prevent electron tunneling when a low potential applied between first electrode 302 and second electrode 310, such as when a reading signal is used. This tunneling control and other characteristics of first buffer layer 304 and second buffer layer 308 depend in part on the thickness of first buffer layer 304 and second buffer layer 308. In some embodiments, each of first buffer layer 304 and second buffer layer 308 has a thickness of between about 5 Angstroms and 100 Angstroms or, more specifically, between about 5 Angstroms and 30 Angstroms. Without being restricted to any particular theory, it is believed that a thinner buffer layer may not sufficiently prevent electron tunneling when a reading signal is applied to ReRAM cell 300. On the other hand, a thicker buffer layer may excessively block electron tunneling and may require a substantial increase in switching power, which is not desirable, when a switching signal is applied. First buffer layer 304 and second buffer layer 308 may have the same thickness or different thicknesses. The thickness of resistive switching layer 306 may be greater than the thickness of each of first buffer layer 304 and second buffer layer 308. In some embodiments, the thickness of resistive switching layer 306 is at least 20% greater than the thickness of each of first buffer layer 304 and second buffer layer 308 or, more specifically, at least 50% greater, or even at least 100% greater.

The combined effects of the electron barrier height and thickness properties may be presented in a simplified manner as a product of the electron barrier height value and thickness value. In some embodiments, the product of the thickness of resistive switching layer 306 times the electron barrier height of the material forming resistive switching layer 306 (i.e., $T_3 \times EBH_3$) is greater than the product of the thickness of first buffer layer 304 times the electron barrier height of the material forming first buffer layer 304 (i.e., $T_2 \times EBH_2$). Furthermore, the product of the thickness of resistive switching layer 306 times the electron barrier height of the material forming resistive switching layer 306 (i.e., $T_3 \times EBH_3$) is greater than the product of the thickness of the second buffer layer 308 times the electron barrier height of the material forming second buffer layer 308 (i.e., $T_4 \times EBH_4$). In other words, $T_3 \times EBH_3 > T_2 \times EBH_2$ and $T_3 \times EBH_3 > T_4 \times EBH_4$. In more specific embodiments, the product of the thickness of resistive switching layer 306 times the electron barrier height of the material forming the resistive switching layer 306 (i.e., $T_3 \times EBH_3$) is at least twice greater than each of the product of the thickness of first buffer layer 304 times the electron barrier height of the material of first buffer layer 304 (i.e., $T_2 \times EBH_2$) and the product of the thickness of second buffer layer 308 times the electron barrier height of the material of second buffer layer 308 (i.e., $T_4 \times EBH_4$). In other words, $T_3 \times EBH_3 > 2 \times (T_2 \times EBH_2)$ and $T_3 \times EBH_3 > 2 \times (T_4 \times EBH_4)$. These conditions can be achieved by using certain materials for first buffer layer 304 and second buffer layer 308 and/or certain thicknesses for first buffer layer 304 and second buffer layer 308. Materials and thickness of resistive switching layer 306 may be driven by other considerations.

In some embodiments, the product of the thickness of first buffer layer 304 times the electron barrier height of the material of first buffer layer 304 (i.e., $T_2 \times EBH_2$) is substantially the same as the product of the thickness of second buffer layer 308 times the electron barrier height of the material of second buffer layer 308 (i.e., $T_4 \times EBH_4$). In other words, $T_4 \times EBH_4 \approx T_2 \times EBH_2$. In these embodiments, first buffer layer 304 and second buffer layer 308 may be formed from the same material and have the same thickness. Alternatively, the material of first buffer layer 304 may have a smaller electron barrier height than the material of second buffer layer 308, but first buffer layer 304 may be thicker than second buffer layer 308 such that the equality of the products (i.e., $T_4 \times EBH_4 \approx T_2 \times EBH_2$) is maintained.

In some embodiments, the electron barrier height of the material of resistive switching layer 306 is greater than 6 eV (i.e., $EBH_3 > 6$ eV) or even greater than 8 eV (i.e., $EBH_3 > 8$ eV). Various examples of suitable materials for resistive switching layer 306 are described below. The electron barrier height of the materials of each of first buffer layer 304 and second buffer layer 308 is less than 4 eV (i.e., $EBH_2 < 4$ eV and $EBH_4 < 4$ eV). In some embodiments, the electron barrier height of the materials of resistive switching layer 306 is greater than each of the electron barrier height of the material of first buffer layer 304 and the electron barrier height of the material of second buffer layer 308 by at least about 0.5 eV (i.e., $EBH_3 \geq EBH_2 + 0.5$ eV and $EBH_3 > EBH_4 + 0.5$ eV).

In some embodiments, first buffer layer 304 and second buffer layer 308 have substantially the same composition. Alternatively, first buffer layer 304 and second buffer layer 308 have different compositions. Examples of materials suitable for first buffer layer 304 and second buffer layer 308 include hafnium oxide, hafnium oxynitride, zirconium oxide, zirconium oxynitride, titanium oxide, titanium oxynitride, tantalum oxide, or tantalum oxynitride. More specifically, each the first buffer layer 304 and the second buffer layer 308 may include one of hafnium oxide, hafnium oxynitride, zirconium oxide, or zirconium oxynitride. In some embodiments, each of first buffer layer 304 and second buffer layer 308 is substantially crystalline. For example, the crystalline content of the each of first buffer layer 304 and second buffer layer 308 may be greater than about 70% by volume or, more specifically, greater than about 80% or even greater than about 90%.

In some embodiments, resistive switching layer 306 is substantially amorphous. For example, the crystalline content of resistive switching layer 306 may be less than about 30% by volume or, more specifically, less than about 20% or even less than about 10%. Resistive switching layer 306 remains amorphous during fabrication and operation of the resistive switching memory cell. Specifically, resistive switching layer 306 may remain amorphous when this layer is subjected to annealing at least 750° C. for at least 1 minute. As described above with reference to FIGS. 1B and 1C, formation and break of conductive paths is attributed to defect mobility within resistive switching layer 306, which is more controllable in amorphous materials. When a crystalline buffer layer directly interfaces with an amorphous resistive switching, the crystal grain boundaries are believed to serve as seeds to form conductive paths with the resistive switching layer. Resistive switching layer 306 may include silicon or aluminum or, more specifically, silicon oxide, silicon oxynitride, aluminum oxide, or aluminum oxynitride.

Electrodes 302 and 310 may be fabricated from a conductive material that has a desirable conductivity, such as p-type polysilicon, n-type polysilicon, transition metals, transition metal alloys, transition metal nitrides, or transition metal carbides. For example, electrode 310 may include one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), or ruthenium (Ru). Electrode 310 may include titanium/aluminum alloy and/or a silicon-doped aluminum. In some embodiments, electrodes 302 and 310 may include titanium, tantalum, or aluminum, such as titanium nitride Electrodes 302 and 310 may be between about 5 nm and about 500 nm thick or, more specifically, between about 10 nm and about 100 nm thick.

FIG. 3B is a schematic illustration of ReRAM cell 320 that has two buffer layers in between each electrode and resistive switching layer 306, in accordance with some embodiments. Specifically, first buffer layer 304 and third buffer layer 303 are both disposed between first electrode 302 and resistive switching layer 306. Likewise, second buffer layer 308 and fourth buffer layer 309 are both disposed between second electrode 310 and resistive switching layer 306. Third buffer layer 303 and fourth buffer layer 309 may be referred to as outer buffer layer to distinguish them from first buffer layer 304 and second buffer layer 308, which may be referred to as inner barrier layers. Examples of materials suitable for third buffer layer 303 and fourth buffer layer 309 include but are not limited to titanium oxide, titanium oxynitride, tantalum oxide, or tantalum oxynitride.

The electron barrier height of the material of third buffer layer 303 may be less than the electron barrier height of the material of first buffer layer 304, which is positioned closer to resistive switching layer 306 that third buffer layer 303. Likewise, the electron barrier height of the material of fourth buffer layer 309 is less than the electron barrier height of the material of second buffer layer 308, which is positioned closer to resistive switching layer 306 that fourth buffer layer 309.

In some embodiments, the product of the thickness of third buffer layer 303 times the electron barrier height of the material of third buffer layer 303 (i.e., $T_6 \times EBH_6$) is less than the product of a thickness of first buffer layer 304 times the electron barrier height of the material of first buffer layer 304 (i.e., $T_2 \times EBH_2$). Likewise, the product of the thickness of fourth buffer layer 309 times the electron barrier height of the material of fourth buffer layer 309 (i.e., $T_7 \times EBH_7$) is less the product of a thickness of second buffer layer 308 times the electron barrier height of the material of second buffer layer 308 (i.e., $T_4 \times EBH_4$). In other words, $T_2 \times EBH_2 > T_6 \times EBH_6$ and $T_4 \times EBH_4 > T_7 \times EBH_7$.

Other components of ReRAM cells may include a current steering element and/or an embedded resistor. A current steering element, if one is present, may be an intervening electrical component, such as a p-n junction diode, p-i-n diode, transistor, or other similar device disposed between first electrode 302 and second electrode 310. As such, the current steering element may be connected in series with resistive switching layer 306. In some embodiments, the current steering element may include two or more layers of semiconductor materials, such as two or more doped silicon layers, that are configured to direct the flow of current through the device. The current steering element may be a diode that includes a p-doped silicon layer, an un-doped intrinsic layer, and an n-doped silicon layer.

An embedded resistor may be also disposed between first electrode 302 and second electrode 310 and, as such, interconnected in series with resistive switching layer 306. The embedded resistor may include a metal silicon nitride, such as tantalum silicon nitride, titanium silicon nitride, and tantalum silicon nitride. The embedded resistor is configured to maintain its resistance substantially constant (e.g., changing by less than 50%) when a switching signal is applied to ReRAM cell 300 and when resistive switching layer 306 changes its resistive state. In some embodiments, one or both of first buffer layer 304 and second buffer layer 308 are operable as embedded resistors.

Processing Examples

Figure 4:
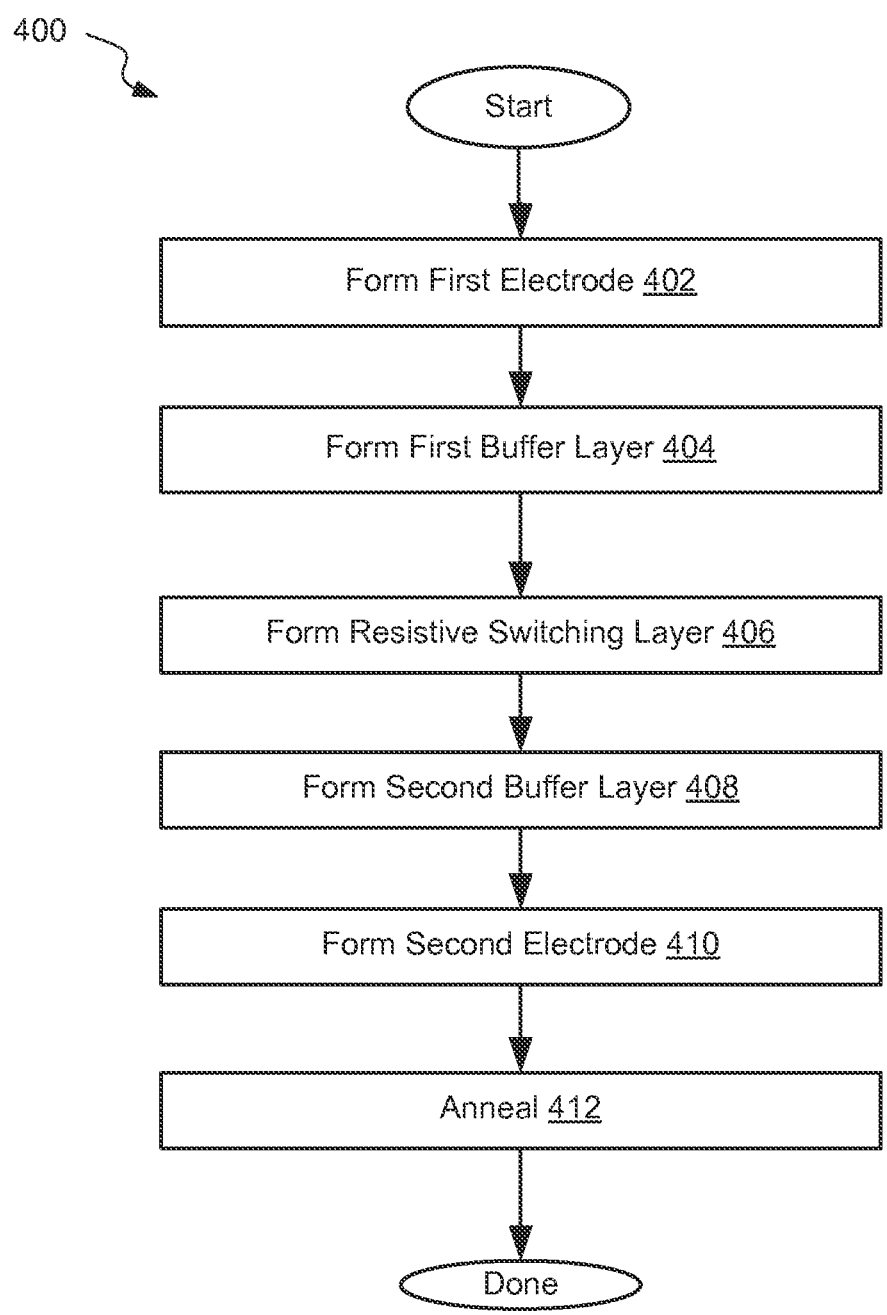
FIG. 4 illustrates a process flowchart corresponding to a method of fabricating a ReRAM cell including at least two buffer layers, in accordance with some embodiments.

FIG. 4 illustrates a process flowchart corresponding to method 400 of fabricating a ReRAM cell, in accordance with some embodiments. Method 400 may commence with forming a first electrode during operation 402. For example, a titanium nitride layer may be formed using PVD or other suitable deposition techniques. Deposition of the titanium nitride layer may be performed using a titanium target in a nitrogen atmosphere. Other processing techniques, such as atomic layer deposition (ALD), chemical vapor deposition (CVD), evaporation, and the like can also be used to deposit the first signal line and, in some embodiments, the current steering element.

Method 400 may proceed with forming a first buffer layer during operation 404. In some embodiments, the first buffer layer may be formed using ALD. Various materials suitable for the first buffer layer are described above. In some embodiments, operation 404 may involve annealing to crystalize the deposited layer. The buffer layer may be formed as a stoichiometric oxide. As a result, a fully oxidized process may be used having long purge cycles and oxidizer pulses. In some embodiments, highly reactive oxygen containing reagent (e.g., $O_3$) is used (rather than water).

Method 400 may proceed with forming a resistive switching layer during operation 406. Any suitable deposition technique may be used to form the resistive switching layer, such as ALD or sputtering. For example, aluminum oxide or aluminum oxynitride may be deposited using a sputtering target including aluminum. Sputtering may be performed in an oxygen-containing atmosphere. In some embodiments, the sputtering environment also includes nitrogen. In this example, the composition of the embedded resistor depends on a concentration of oxygen (and nitrogen, if one is used) in the sputtering environment as well as relative amounts of aluminum in the sputtering target. For example, an aluminum oxide layer may be formed using reactive sputtering by employing a metal aluminum target in a 20-60% oxygen atmosphere. These process parameters are provided as examples and generally depend on deposited materials, tools, deposition rates, and other factors. Silicon oxide or silicon oxynitride may be formed using ALD, CVD, or other suitable techniques.

Method 400 may proceed with forming a second buffer layer during operation 408. Operation 408 may be similar to operation 404. Method 400 may proceed with forming a second electrode layer during operation 410. Operation 410 may be similar to operation 402. Method 400 may proceed with annealing operation 412. Annealing may be used to crystalize materials of the first and second buffer layers. In some embodiments, annealing may be performed at a temperature of between about 500° C. and 900° C., such as around 750° C. This annealing may be a part of another operation, such as activation of diodes used for addressing cells in a memory array. In some embodiments, operation 412 is performed before operation 410.

Memory Array Examples

Figure 5A:
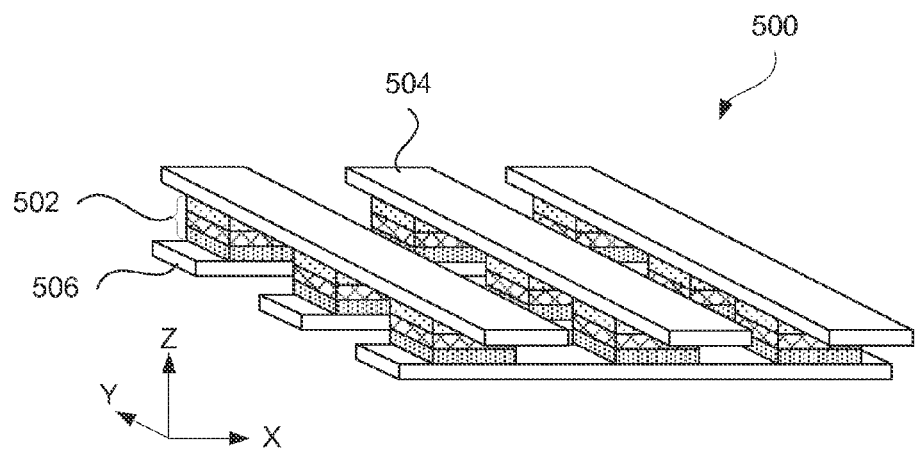
FIGS. 5A and 5B illustrate schematic views of memory arrays including multiple ReRAM cells, in accordance with some embodiments.

A brief description of memory arrays will now be described with reference to FIGS. 5A and 5B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 5A illustrates a memory array 500 including nine ReRAM cells 502, in accordance with some embodiments. In general, any number of ReRAM cells may be arranged into one array. Connections to each ReRAM cell 502 are provided by signal lines 504 and 506, which may be arranged orthogonally to each other. ReRAM cells 502 are positioned at crossings of signal lines 504 and 506 that typically define boundaries of each ReRAM cell in array 500.

Signal lines 504 and 506 are sometimes referred to as word lines and bit lines. These lines are used to read and write data into each ReRAM cell 502 of array 500 by individually connecting ReRAM cells to read and write controllers. Individual ReRAM cells 502 or groups of ReRAM cells 502 can be addressed by using appropriate sets of signal lines 504 and 506. Each ReRAM cell 502 typically includes multiple layers, such as first and second electrodes, resistive switching layer, embedded resistors, embedded current steering elements, and the like, some of which are further described elsewhere in this document. In some embodiments, a ReRAM cell includes multiple resistive switching layers provided in between a crossing pair of signal lines 504 and 506.

As stated above, various read and write controllers may be used to control operations of ReRAM cells 502. A suitable controller is connected to ReRAM cells 502 by signal lines 504 and 506 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 500 or each ReRAM cell 502. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 5B:
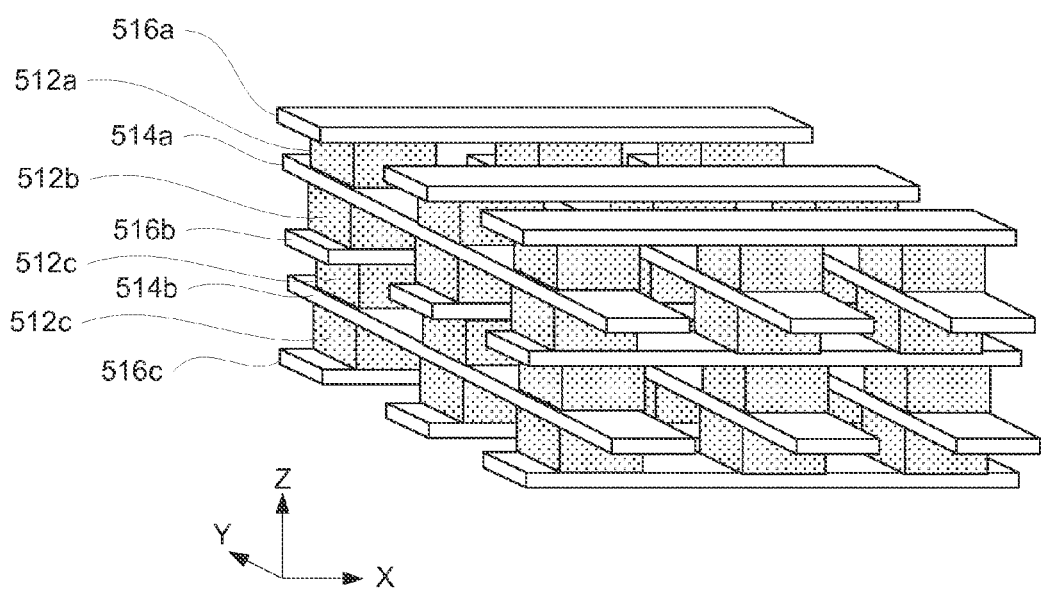

In some embodiments, a memory device may include multiple array layers as, for example, illustrated in FIG. 5B. In this example, five sets of signal lines 514a-b and 516a-c are shared by four ReRAM arrays 512a-c. As with the previous example, each ReRAM array is supported by two sets of signal lines, e.g., array 512a is supported by 514a and 516a. However, middle signal lines 514a-b and 516b, each is shared by two sets ReRAM arrays. For example, signal line set 514a provides connections to arrays 512a and 512b. First and second sets of signal lines 516a and 516c are only used for making electrical connections to one array. This 3-D arrangement of the memory device should be distinguished from various 3-D arrangements in each individual ReRAM cell.

Conclusion

Although the foregoing examples have been described in some detail for purposes of clarity of understanding, the invention is not limited to the details provided. There are many alternative ways of implementing the invention. The disclosed examples are illustrative and not restrictive.

What is claimed:

1. A resistive switching memory cell comprising:
a first layer disposed over a substrate;
a second layer disposed over the first layer such that the first layer is disposed between the second layer and the substrate;
a third layer disposed over the second layer such that the second layer is disposed between the first layer and the third layer;
a fourth layer disposed over the third layer such that the third layer is disposed between the second layer and the fourth layer; and
a fifth layer disposed over the fourth layer such that the fourth layer is disposed between the third layer and the fifth layer;
wherein the first layer and the fifth layer are operable as electrodes;
wherein the third layer is operable to switch between at least two different resistive states;
wherein the third layer comprises silicon;
wherein an electron barrier height of a material of each of the second layer and the fourth layer is less than an electron barrier height of a material of the third layer; and
wherein a product of a thickness of the third layer times the electron barrier height of the material of the third layer ($T_3 \times EBH_3$) is greater than each of a product of a thickness of the second layer times the electron barrier height of the material of the second layer ($T_2 \times EBH_2$) and a product of a thickness of the fourth layer times the electron barrier height of the material of the fourth layer ($T_4 \times EBH_4$).

2. The resistive switching memory cell of claim 1, wherein the second layer and the fourth layer have substantially same compositions.

3. The resistive switching memory cell of claim 1, wherein each of the second layer and the fourth layer comprises one of hafnium oxide, hafnium oxynitride, zirconium oxide, zirconium oxynitride, titanium oxide, titanium oxynitride, tantalum oxide, or tantalum oxynitride.

4. The resistive switching memory cell of claim 1, wherein each of the second layer and the fourth layer comprises one of hafnium oxide, hafnium oxynitride, zirconium oxide, or zirconium oxynitride.

5. The resistive switching memory cell of claim 1, wherein the third layer comprises one of silicon oxide or silicon oxynitride.

6. The resistive switching memory cell of claim 1, wherein the second layer and the fourth layer have substantially a same thicknesses.

7. The resistive switching memory cell of claim 1, wherein a thickness of the third layer is greater than a thickness of each of the second layer and the fourth layer.

8. The resistive switching memory cell of claim 1, wherein the product of the thickness of the third layer times the electron barrier height of the material of the third layer ($T_3 \times EBH_3$) is at least twice greater than each of the product of the thickness of the second layer times the electron barrier height of the material of the second layer ($T_2 \times EBH_2$) and the product of the thickness of the fourth layer times the electron barrier height of the material of the fourth layer ($T_4 \times EBH_4$).

9. The resistive switching memory cell of claim 1, wherein the third layer directly interfaces each of the second layer and the fourth layer.

10. The resistive switching memory cell of claim 1, wherein the electron barrier height of the material of the third layer is greater than 6 eV.

11. The resistive switching memory cell of claim 1, wherein the electron barrier height of the material of the third layer is greater than 8 eV.

12. The resistive switching memory cell of claim 1, wherein the electron barrier height of the materials of each of the second layer and the third layer is less than 4 eV.

13. The resistive switching memory cell of claim 1, wherein the electron barrier height of the materials of the third layer is greater than each of the electron barrier height of the material of the second layer and the electron barrier height of the material of the fourth layer by at least about 0.5 eV.

14. The resistive switching memory cell of claim 1, wherein the third layer is amorphous.

15. The resistive switching memory cell of claim 14, wherein each of the second layer and the fourth layer is crystalline.

16. The resistive switching memory cell of claim 1, further comprising a sixth layer and a seventh layer;
wherein the sixth layer is disposed between the first layer and the second layer;
wherein an electron barrier height of a material of the sixth layer is less than the electron barrier height of the material the second layer;
wherein the seventh layer is disposed between the fourth layer and the fifth layer; and
wherein an electron barrier height of a material of the seventh layer is less than the electron barrier height of the material of the fourth layer.

17. The resistive switching memory cell of claim 16, wherein each of the sixth layer and the seventh layer comprises one of titanium oxide, titanium oxynitride, tantalum oxide, or tantalum oxynitride.

18. The resistive switching memory cell of claim 16,
wherein a product of a thickness of the sixth layer times the electron barrier height of the material of the sixth layer ($T_6 \times EBH_6$) is less than a product of a thickness of the second layer times the electron barrier height of the material of the second layer ($T_2 \times EBH_2$); and
wherein a product of a thickness of the seventh layer times the electron barrier height of the material of the seventh layer ($T_7 \times EBH_7$) is less a product of a thickness of the fourth layer times the electron barrier height of the material of the fourth layer ($T_4 \times EBH_4$).

* * * * *